(12) United States Patent
Graettinger et al.

(10) Patent No.: US 7,419,913 B2
(45) Date of Patent: Sep. 2, 2008

(54) METHODS OF FORMING OPENINGS INTO DIELECTRIC MATERIAL

(75) Inventors: Thomas M. Graettinger, Boise, ID (US); John K. Zahurak, Boise, ID (US); Shane J. Trapp, Boise, ID (US); Thomas Arthur Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 11/217,905

(22) Filed: Sep. 1, 2005

(65) Prior Publication Data
US 2007/0049037 A1   Mar. 1, 2007

(51) Int. Cl.
*H01L 21/461* (2006.01)

(52) U.S. Cl. .................. 438/706; 438/692; 438/689; 438/708; 438/672; 438/675; 257/296; 257/300; 257/377

(58) Field of Classification Search .............. 438/706; 257/296
See application file for complete search history.

(56) References Cited

U.S. PATENT DOCUMENTS

| | | | | |
|---|---|---|---|---|
| 4,484,979 A | * | 11/1984 | Stocker | ...... 438/713 |
| 5,451,551 A | * | 9/1995 | Krishnan et al. | ...... 438/626 |
| 6,258,707 B1 | | 7/2001 | Uzoh | |
| 6,358,837 B1 | * | 3/2002 | Miller et al. | ...... 438/622 |
| 6,933,192 B1 | | 8/2005 | Divakaruni et al. | |
| 6,969,685 B1 | * | 11/2005 | Li et al. | ...... 438/710 |
| 2003/0068896 A1 | | 4/2003 | Howard et al. | |

FOREIGN PATENT DOCUMENTS

| | | |
|---|---|---|
| EP | 1306894 A1 | 5/2003 |
| WO | US2006/033014 | 2/2007 |
| WO | WO PCT/US06/33014 | 1/2008 |

OTHER PUBLICATIONS

R. Boucher, Microelectronic Engineering, vol. 73-74, Jun. 2004, pp. 330-335.*

* cited by examiner

*Primary Examiner*—Nadine Norton
*Assistant Examiner*—Maki Angadi
(74) *Attorney, Agent, or Firm*—Wells St. John P.S.

(57) ABSTRACT

This invention includes methods of forming openings into dielectric material. In one implementation, an opening is partially etched through dielectric material, with such opening comprising a lowest point and opposing sidewalls of the dielectric material. At least respective portions of the opposing sidewalls within the opening are lined with an electrically conductive material. With such electrically conductive material over said respective portions within the opening, plasma etching is conducted into and through the lowest point of the dielectric material of the opening to extend the opening deeper within the dielectric material. Other aspects and implementations are contemplated.

38 Claims, 18 Drawing Sheets

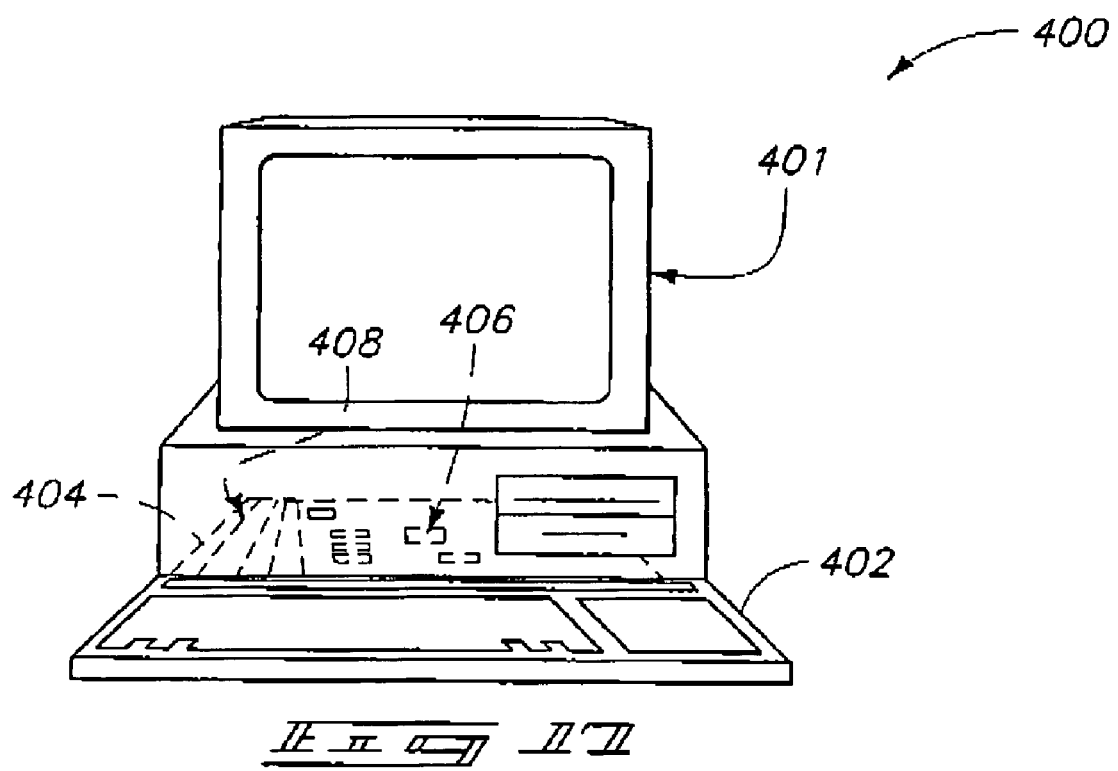
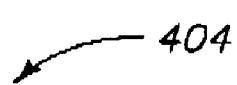
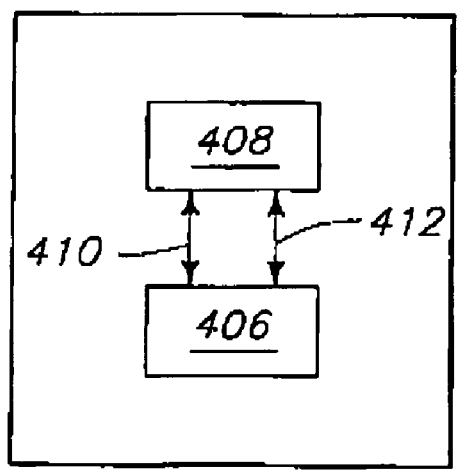

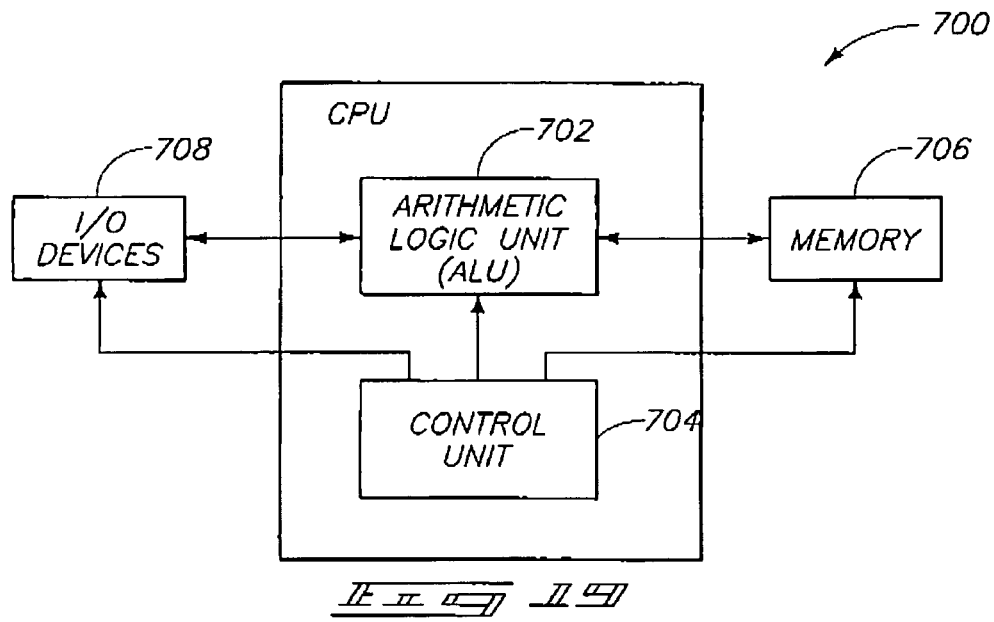
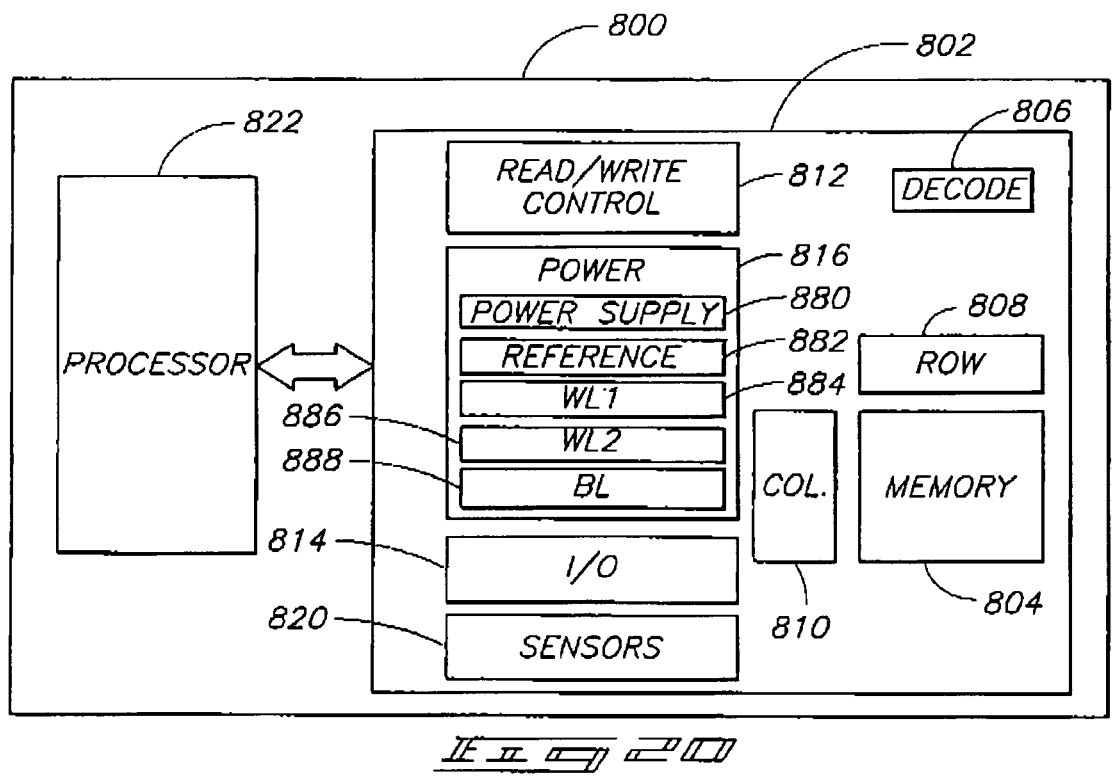

METHODS OF FORMING OPENINGS INTO DIELECTRIC MATERIAL

TECHNICAL FIELD

This invention relates to methods of forming openings into dielectric material.

BACKGROUND OF THE INVENTION

Integrated circuits are typically fabricated onto and within semiconductor substrates, with the continuing trend being towards manufacturing ever-smaller devices. Capacitors are one type of component which is commonly used in the fabrication of integrated circuitry, for example in DRAM circuitry. A typical capacitor is comprised of two conductive electrodes separated by a non-conducting dielectric region. As integrated circuitry density has increased, there is a continuing challenge to maintain sufficiently high storage capacitance despite typically decreasing capacitor area. The increase in density of integrated circuitry has typically resulted in a greater reduction in the horizontal dimension of capacitors as compared to the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

One manner of etching openings within dielectric materials, whether capacitor openings, contact openings, or other openings, includes plasma etching. Here, the bombarding species typically comprises electrons which one or both of physically or chemically interact with the dielectric material, typically through mask openings to transfer the pattern of the mask openings into the dielectric material. However in some instances, particularly where the depth of the opening reaches and exceeds twenty times its narrowest width, continued plasma etching can be at a considerably reduced rate, or direct the etching action away from orthogonal to the substrate. Such phenomenon may, in part, be due to the collection of positive ions from the etching species within the lowest point of the openings being etched.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming openings into dielectric material. In one implementation, an opening is partially etched through dielectric material, with such opening comprising a lowest point and opposing sidewalls of the dielectric material. At least respective portions of the opposing sidewalls within the opening are lined with an electrically conductive material. With such electrically conductive material over said respective portions within the opening, plasma etching is conducted into and through the lowest point of the dielectric material of the opening to extend the opening deeper within the dielectric material.

In one implementation, a method of forming an opening into dielectric material includes forming patterned masking material over dielectric material of a substrate. An opening is partially etched into the dielectric material using the patterned masking material as a mask during a first etching. The opening comprises opposing sidewalls. After the first etching, only some of the patterned masking material is removed from the substrate at least proximate the opening. After the removing, an electrically conductive material is deposited over remaining of the patterned masking material and to within the opening over at least respective portions of the opposing sidewalls. With such electrically conductive material over the respective portions within the opening, a second etching of the dielectric material is conducted to extend the opening deeper within the dielectric material, and wherein the second etching comprises plasma etching.

In one implementation, a method of forming an opening into dielectric material includes forming patterned masking material over dielectric material of a substrate. An opening is etched partially into the dielectric material using the patterned masking material as a mask during a first etching. The opening includes a lowest point and opposing sidewalls. After the first etching, an electrically conductive material is deposited over the patterned masking material and to within the opening over at least respective portions of the opposing sidewalls and over the opening lowest point. After such depositing, the conductive material is etched effective to expose the opening lowest point. After etching the conductive material and with such electrically conductive material over the respective portions within the opening, second etching is conducted of the dielectric material to extend the opening deeper within the dielectric material, and wherein the second etching comprises plasma etching.

Other aspects and implementations are contemplated.

BRIEF DESCRIPTION OF THE DRAWINGS

Preferred embodiments of the invention are described below with reference to the following accompanying drawings.

FIG. 17 is a diagrammatic view of a computer illustrating an exemplary application of the present invention.

FIG. 18 is a block diagram showing particular features of the motherboard of the FIG. 17 computer.

FIG. 19 is a high-level block diagram of an electronic system according to an exemplary aspect of the present invention.

FIG. 20 is a simplified block diagram of an exemplary electronic system according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
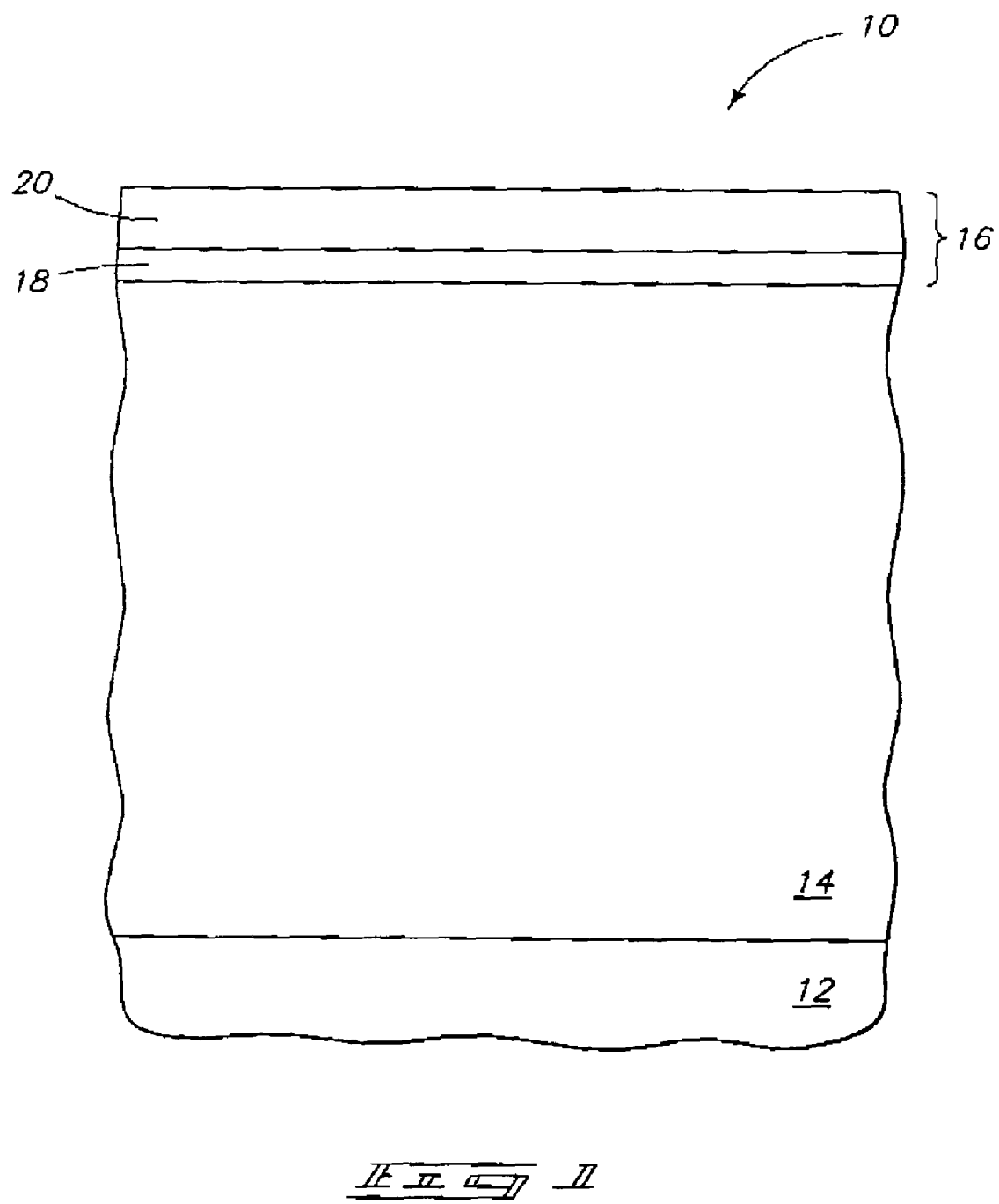
FIG. 1 is a diagrammatic, cross-sectional view of a semiconductor wafer fragment in process in accordance with an aspect of the invention.

Exemplary preferred methods of forming openings into dielectric material are described with reference to FIGS. 1-15. Referring to FIG. 1, a substrate fragment is indicated generally with reference numeral 10. Such preferably comprises a semiconductor substrate, for example a bulk monocrystalline silicon substrate 12 having a dielectric material 14 received thereover. In the context of this document, the term "semiconductor substrate" or semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An exemplary material 12 includes lightly doped monocrystalline silicon, although semiconductor-on-insulator substrates, as well as other substrates regardless of semiconductor properties, are also contemplated. An exemplary preferred material 14 includes borophosphosilicate glass (BPSG), with an exemplary preferred thickness range being from 15,000 Angstroms to 40,000 Angstroms. By way of example only, alternate exemplary materials 14 include carbon doped silicon dioxide, silicon nitride, silicon carbide, silicon oxynitrides, aluminum oxide, hafnium oxide, germanium oxide, phosphosilicate glass, undoped silicon dioxide for example deposited by decomposition of tetraethylorthosilicate, and spin-on-glass.

A masking material 16 is received over dielectric material 14 of substrate 10. Such is preferably formed on material 14, with "on" in the context of this document meaning in at least some direct physical contact with the stated material. Masking material 16 might be of substantially uniform composition throughout its thickness, or alternately might comprise two or more layers of different composition materials. FIG. 1 depicts masking material 16 as consisting essentially of only two layers of different composition materials, namely with an inner layer 18 and an outer layer 20. Either layer might be electrically conductive, electrically insulative, or semiconductive. By way of example only, an exemplary preferred electrically insulative material for layer 18 includes amorphous carbon, and an exemplary conductive material includes conductively doped polysilicon, titanium nitride, aluminum and/or tungsten. Layer 20 preferably comprises a photoimagable material, for example photoresist. An exemplary preferred thickness range for layer 18 is from 1,000 Angstroms to 20,000 Angstroms, while that for layer 20 is from 1,000 Angstroms to 10,000 Angstroms.

Figure 2:
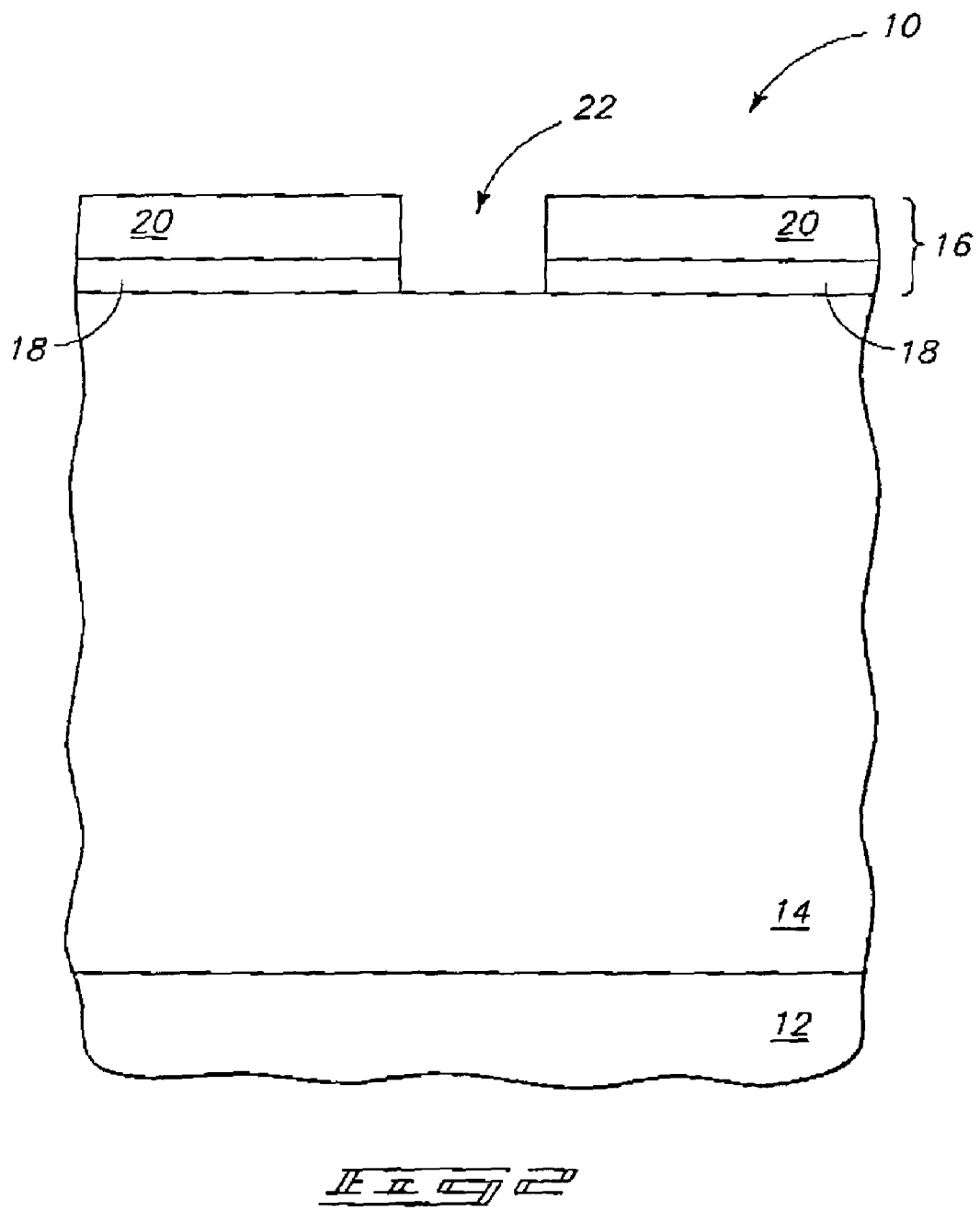
FIG. 2 is a view of the FIG. 1 wafer fragment at a point of processing subsequent to that depicted by FIG. 1.

Referring to FIG. 2, an opening 22 has been formed within masking material 16, preferably completely therethrough to dielectric material 14. By way of example only, such is but one method of forming a patterned masking material over dielectric material of a substrate in a method of forming an opening into such dielectric material in accordance with certain aspects of the invention. Any other existing or yet-to-be developed method of forming patterned masking material over dielectric material of a substrate is also, of course, contemplated, and regardless of whether photolithography is utilized. A typical method of producing the FIG. 2 construction would be to photopattern a preferred photoresist layer 20 to form opening 22 initially to extend to a preferred hard masking material 18, followed by the etching of material 18 substantially selectively relative to photoresist material 20.

Figure 3:
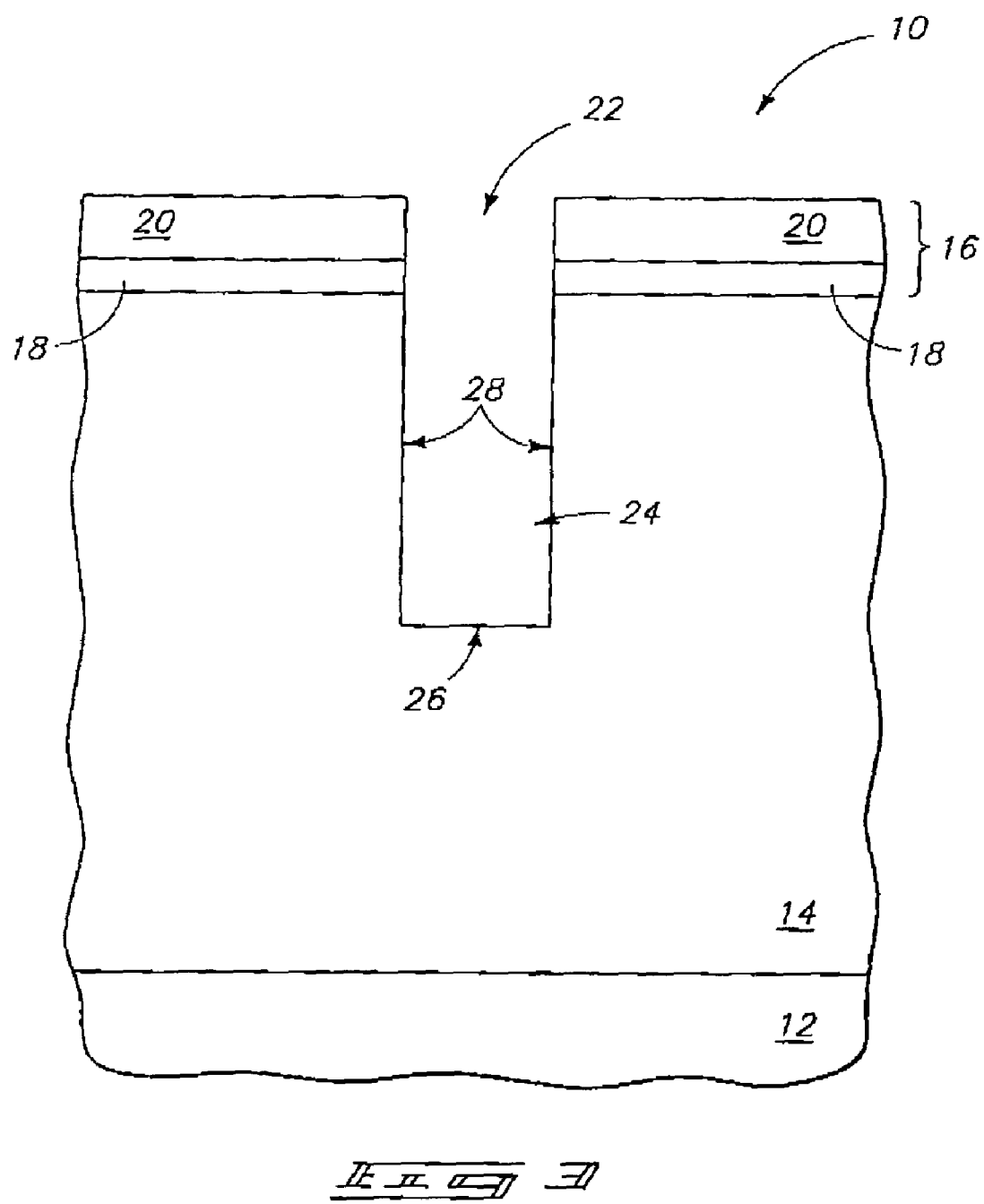
FIG. 3 is a view of the FIG. 2 wafer fragment at a point of processing subsequent to that depicted by FIG. 2.

Referring to FIG. 3, an opening 24 has been partially etched into dielectric material 14 using patterned masking material 16 as a mask. However, aspects of the invention contemplate etching opening 24 partially through dielectric material 14 independent of the use of a mask. Regardless, a preferred manner of etching to form opening 24 of FIG. 3 is by plasma etching. An exemplary preferred technique, where material 20 comprises photoresist, material 18 comprises amorphous carbon and material 14 comprises BPSG includes using a fluorocarbon chemistry. $C_4F_8$, $C_4F_6$, $CF_4$, $O_2$, $CF_3$ (including combinations of these, and with or without inert gases such as Ar, Xe,) are exemplary chemistries. Multi-frequency medium or high density plasma, parallel plate and RIE are exemplary reactor types. In one exemplary embodiment, opening 24 as partially etched into dielectric material 14 can be considered as comprising a lowest point 26 and opposing sidewalls 28. Lowest point 26 might be a generally horizontally oriented base with opposing sidewalls being substantially parallel as shown. Alternately by way of example only, lowest point 26 might result from a rounded, undulating, and/or rough base. Further alternately by way of example only, some or all of opposing sidewalls 28 might angle toward one another to form lowest point 26 as more of a point location or a knife-edge line. Further alternately by way of example only, some or all of opposing sidewalls 28 might angle away from one another.

Regardless, in one implementation, and in accordance with overcoming problems identified in the above Background Section which motivated the invention, opening 24 is etched to preferably have an aspect ratio of no greater than 20:1 or no greater than 30:1, for example such that the etching direction and etching rate of material 14 is not compromised. Further preferably, partially etched opening 24 has an aspect ratio of at least 10:1, and more preferably of at least 15:1. By way of example only, a typical depth for partially etched opening 24 within material 14 is from 10,000 Angstroms to 20,000 Angstroms, with an exemplary minimum outermost width of opening 24 being from 500 Angstroms to 2,000 Angstroms.

Figure 4:
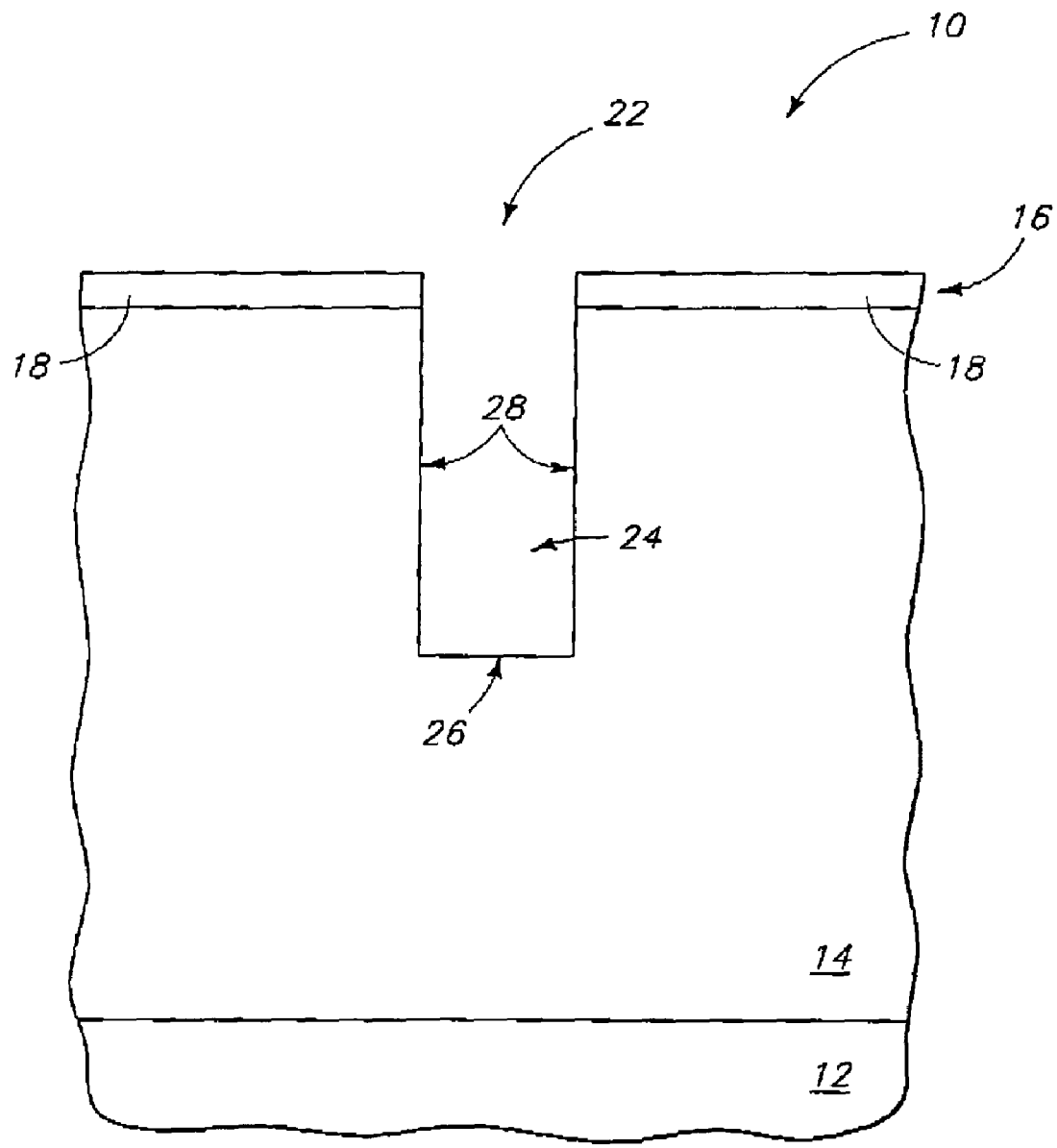
FIG. 4 is a view of the FIG. 3 wafer fragment at a point of processing subsequent to that depicted by FIG. 3.

Referring to FIG. 4, some, and only some, of patterned masking material 16 has been removed from substrate 10 at least proximate opening 24. In one preferred implementation, such removing is of a majority of masking material 16 from substrate 10 at least proximate opening 24, and in one exemplary and depicted embodiment is of all of outer layer 20 of the two layers 18 and 20 of different composition materials. For example where material 20 comprises photoresist, an exemplary preferred removal technique comprises $O_2$ plasma ashing.

Figure 5:
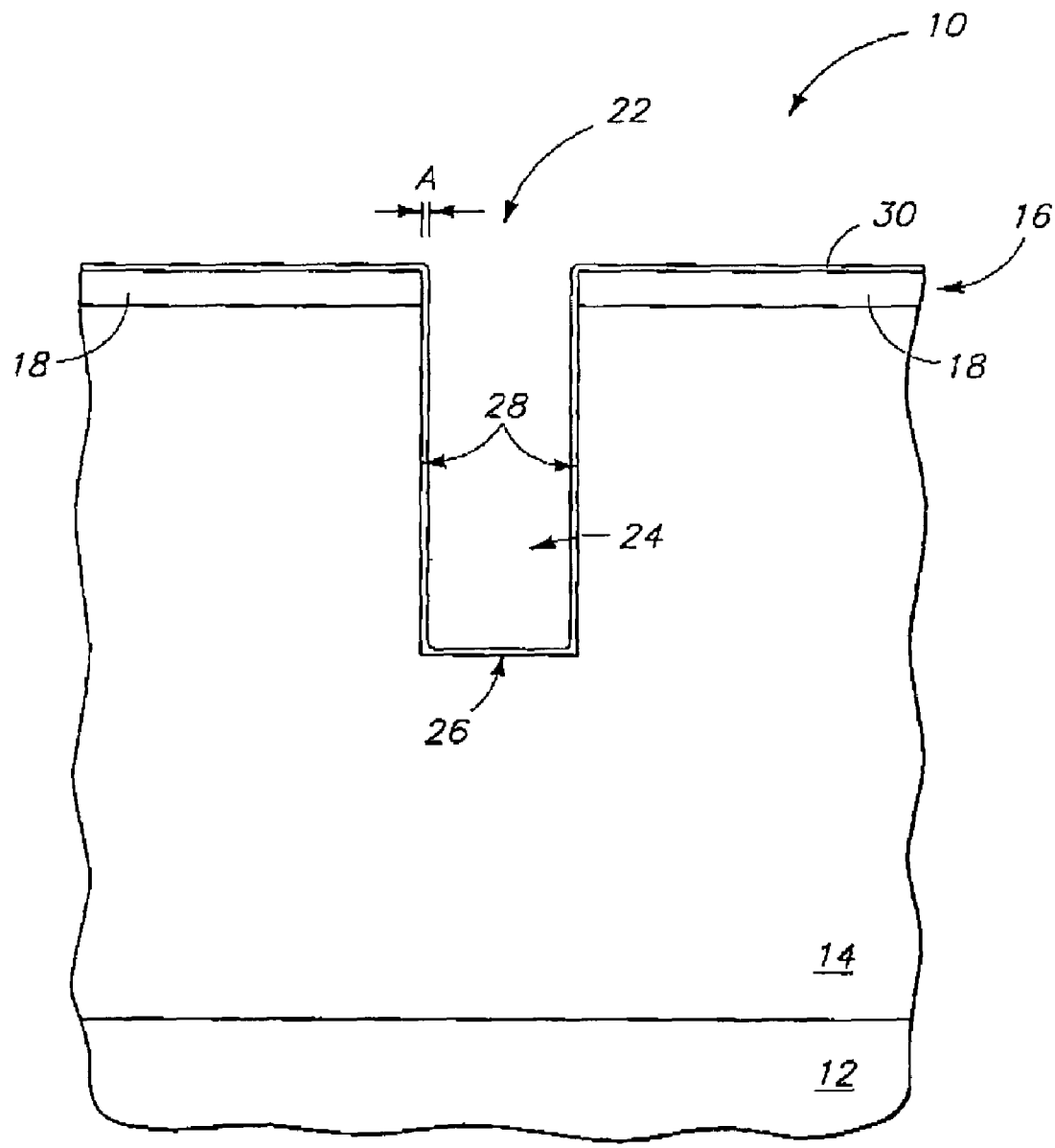
FIG. 5 is a view of the FIG. 4 wafer fragment at a point of processing subsequent to that depicted by FIG. 4.

Referring to FIG. 5, an electrically conductive material 30 has been deposited over the remaining of patterned masking material 16 and to within opening 24 over at least respective portions of opposing sidewalls 28. In the depicted preferred embodiment, conductive material 30 is received over or lines all of opposing sidewalls 28 with electrically conductive material, and in one implementation might also likely be received over opening lowest point 26. Such provides but one exemplary preferred embodiment of lining at least respective portions of opposing sidewalls 28 within opening 24 with an electrically conductive material, and regardless of whether a patterned masking material is utilized and, if so, regardless of whether some, none or all of such masking material is removed prior to depositing conductive material 30. By way of example only, exemplary preferred conductive materials include titanium nitride, aluminum, tungsten and conductively doped polysilicon.

In one preferred implementation, electrically conductive material 30 has a lateral thickness "A" over opposing sidewall portions 28 of from 0.1% to 40% of a minimum open dimension of an outermost portion of opening 24 within material 14 prior to the deposition of material 30, and more preferably from 3% to 10% of such minimum open dimension. Further by way of example only in one preferred implementation, electrically conductive material 30 has a lateral thickness "A" over opposing sidewall portions 28 of no greater than 100 Angstroms.

Figure 6:
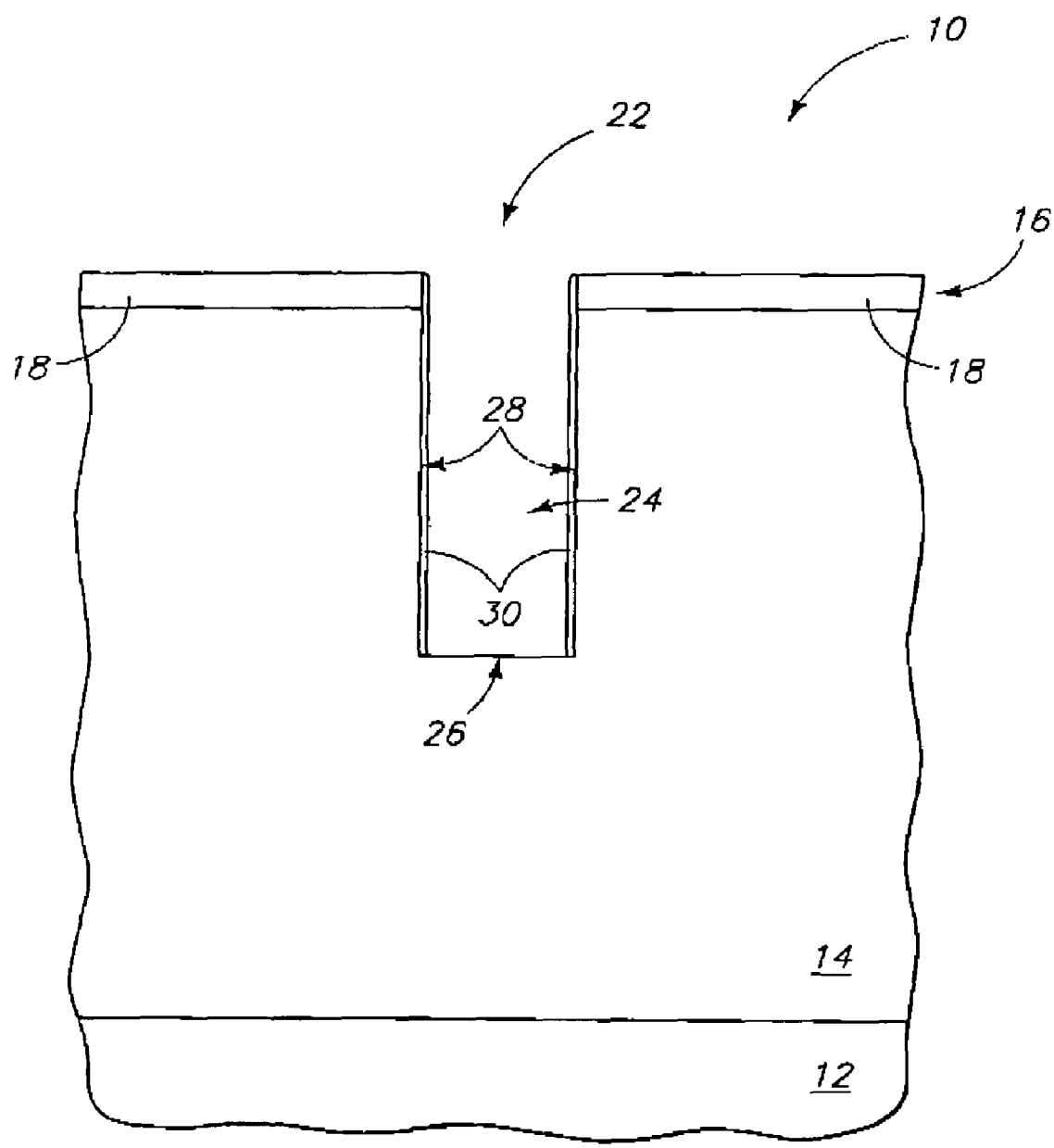
FIG. 6 is a view of the FIG. 5 wafer fragment at a point of processing subsequent to that depicted by FIG. 5.

Referring to FIG. 6, and in but one exemplary preferred embodiment, conductive material 30 has been etched effective to expose opening lowest point 26 of dielectric material 14. An exemplary preferred etching chemistry where material 30 comprises conductively doped polysilicon or titanium nitride, masking material 18 comprises amorphous carbon, and dielectric material 14 comprises BPSG, includes $Cl_2$ and He.

Figure 7:
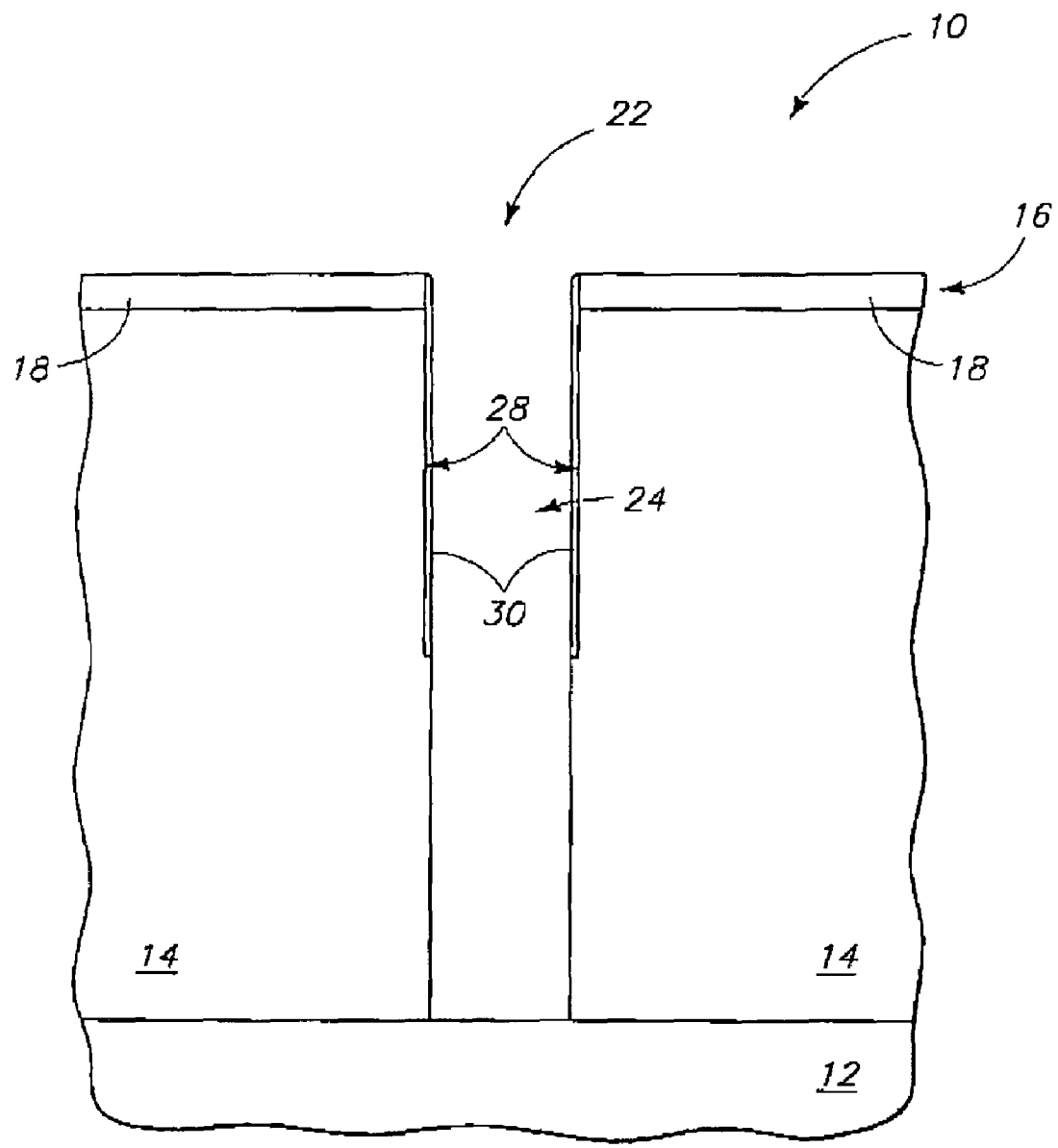
FIG. 7 is a view of the FIG. 6 wafer fragment at a point of processing subsequent to that depicted by FIG. 6.

Referring to FIG. 7, and with electrically conductive material 30 received over the respective portions of opposing sidewalls 28 within opening 24, dielectric material 14 is etched to extend opening 24 deeper within dielectric material 14, with such etching comprising plasma etching, for example the plasma etching described above. The etching of FIG. 4 might be considered as a first etching of material 14, whereas the etching of material 14 of FIG. 7 might be considered as a second etching. However in the context of this document, such use of "first" and "second" indicates a temporal relationship of the respective etchings relative to one another, and not necessarily a first ever or second ever etching of an opening (or otherwise) of material 14. Regardless and by way of example only, conductive material 30 might function in a plasma etching technique of extending opening 24 to deeper within material 14 by providing a conductive flow path for positive ions of the etching species to flow outwardly of the opening, thereby possibly reducing or precluding a reduction of etch rate or a change in etching direction.

Figure 8:
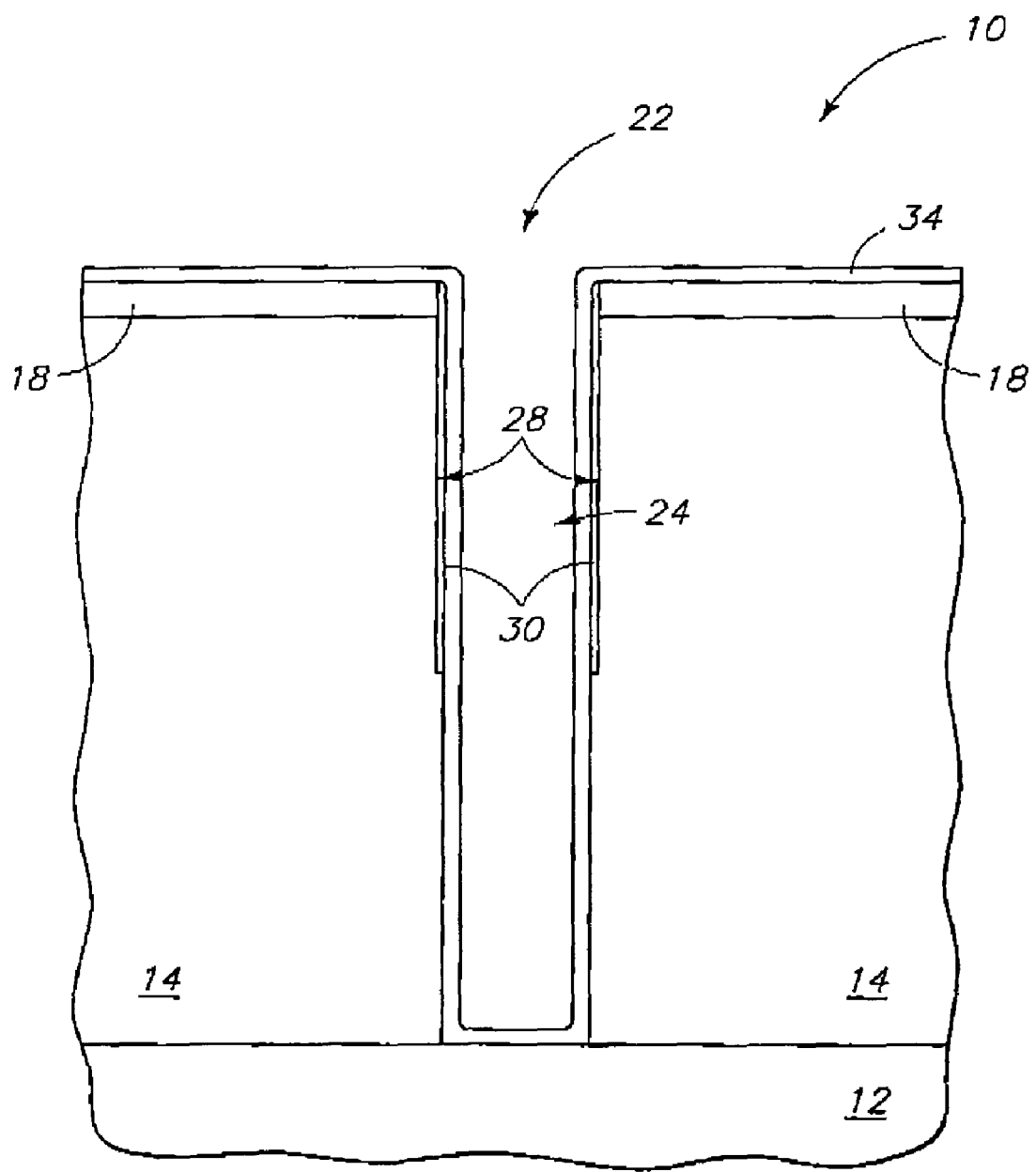
FIG. 8 is a view of the FIG. 7 wafer fragment at a point of processing subsequent to that depicted by FIG. 7.
Figure 9:
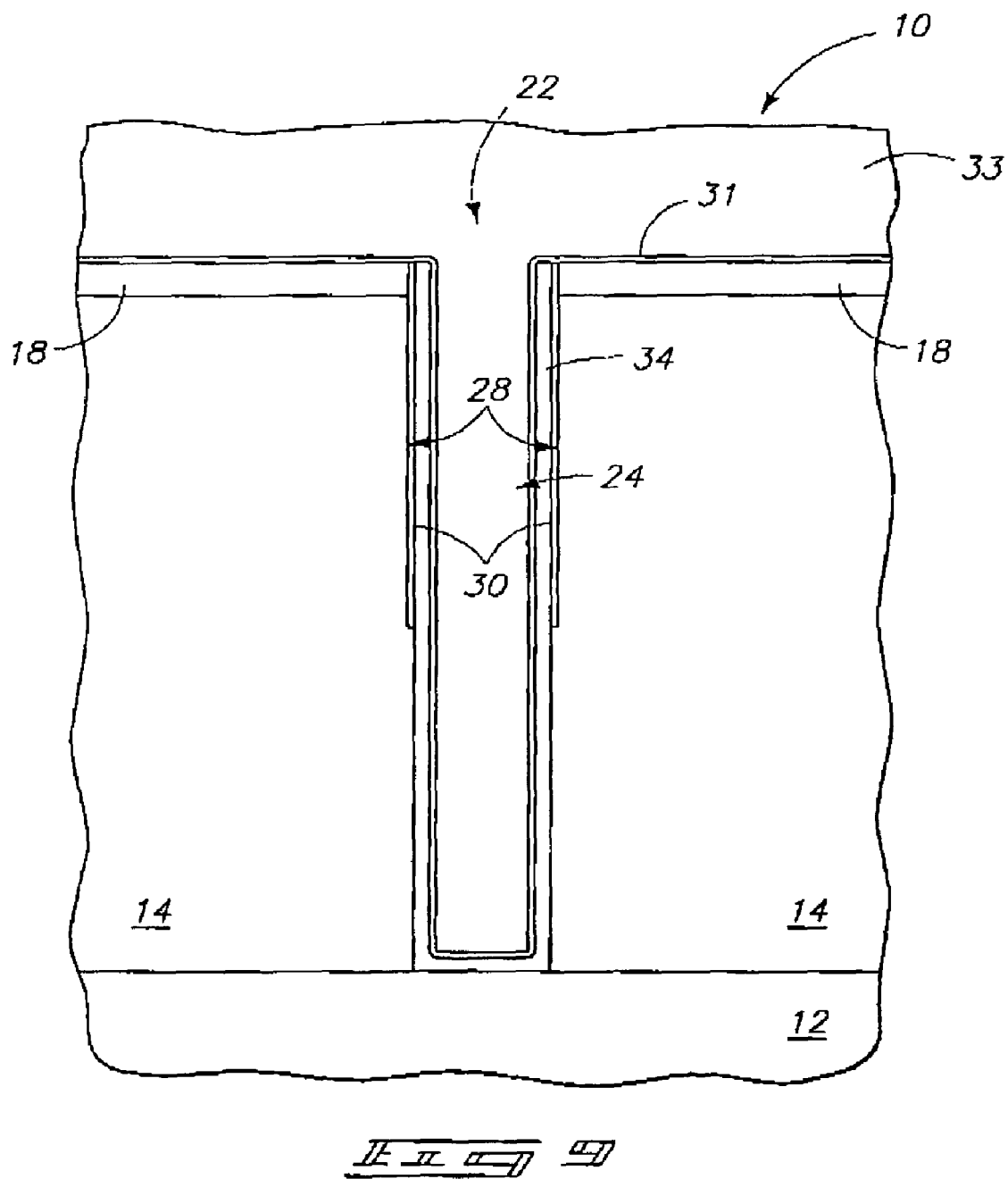
FIG. 9 is a view of the FIG. 8 wafer fragment at a point of processing subsequent to that depicted by FIG. 8.

Conductive material 30 might be removed from the extended opening after the plasma etching of FIG. 7, or might alternately remain as part of finished integrated circuitry construction. For example and by way of example only, FIG. 8 depicts the deposition of more electrically conductive material 34 to within opening 24 over electrically conductive material 30 which lines the respective sidewall portions 28. Such additional conductive material 34 might be of the same composition as that of electrically conductive material 30, or might be of different composition. Further, material 34 might be insulative or semiconductive, and thereby be another (different composition) material. In one implementation where material 34 is conductive, at least portions of materials 30 and 34 can be utilized in the ultimate fabrication of integrated circuitry, thereby providing a conductive component thereof. For example and by way of example only, the substrate of FIG. 8 might be polished to remove material 34 outwardly of layer 18 (or alternately, polished all the way to dielectric material 14), thereby forming a container capacitor storage node, for example of DRAM circuitry, relative to dielectric material 14. FIG. 9 depicts such, and subsequent fabrication of a capacitor dielectric layer 31 and an outer capacitor electrode 33, with materials 30 and 34 forming a capacitor electrode received at least partially within extended opening 24, thereby forming a capacitor. Alternately, by way of example only, material 34 might also have been deposited to a thickness suitable to completely fill the remaining volume of opening 24.

FIG. 7 also depicts, in one preferred exemplary embodiment, that at least some masking material 16 remains over substrate 10 after the depicted second etching. Such exemplary remaining material 16 (for example layer 18) might be completely removed from substrate 10 subsequent to the FIG. 7 second etching, or alternately, might remain as a conductive, semiconductive, or dielectric portion of the ultimate integrated circuitry being fabricated. Alternately by way of example only, all of remaining masking material 16 might be completely etched during the act of etching to extend opinion 24 further within dielectric material 14.

Figure 10:
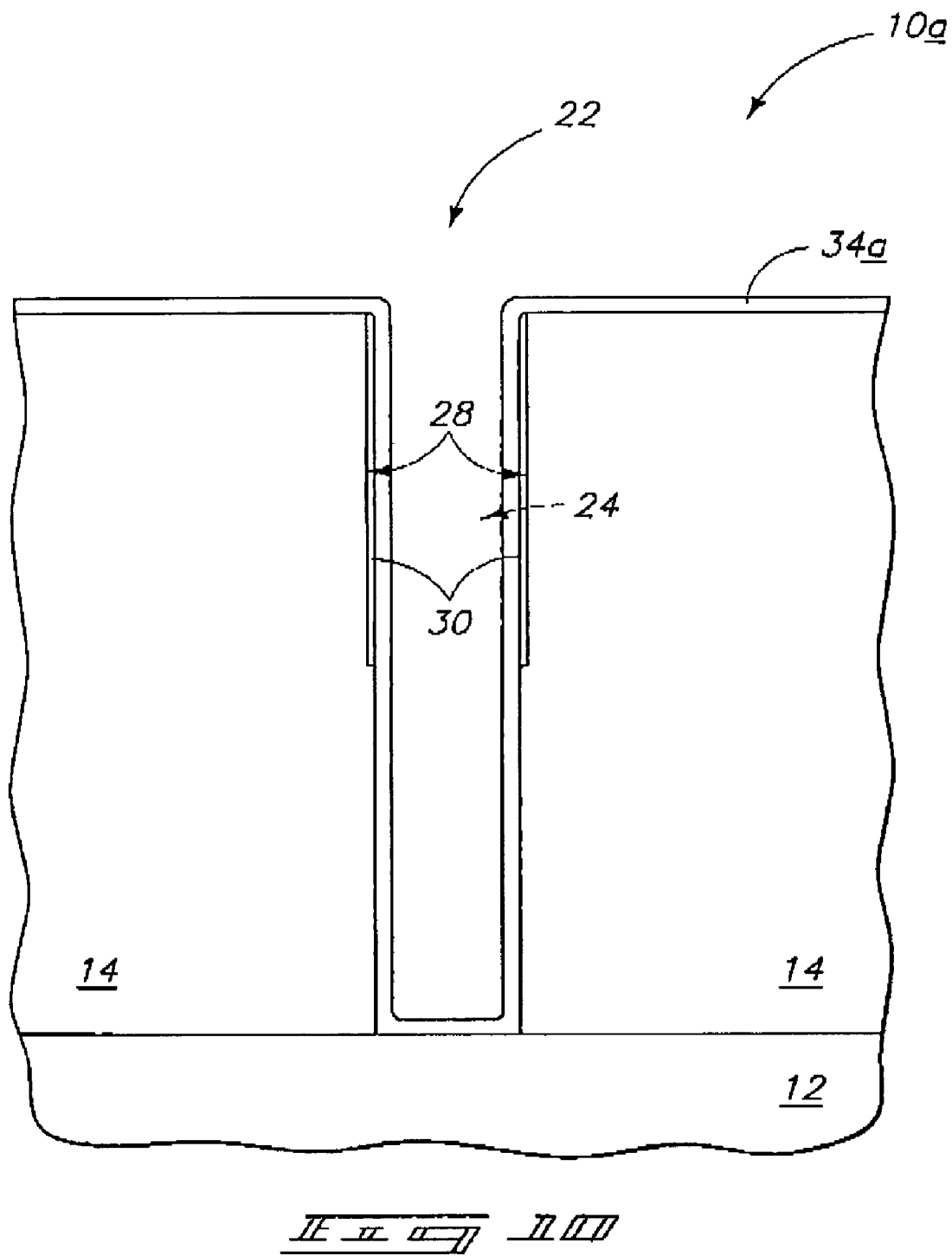
FIG. 10 is a diagrammatic, cross-sectional view of a semiconductor wafer fragment in process in accordance with an aspect of the invention.

By way of example only, FIG. 10 depicts an alternate exemplary embodiment substrate fragment 10*a*. Like numerals from the first-described embodiment have been utilized where appropriate, with differences being indicated with the suffix "a". FIG. 10 depicts the removal of all of masking material 16 (not shown) either commensurate with the extension of opening 24 within dielectric material 14 or subsequent removal thereof after such etching. Thereby, exemplary material 34*a* is shown received on the outermost surface of dielectric material 14.

Figure 11:
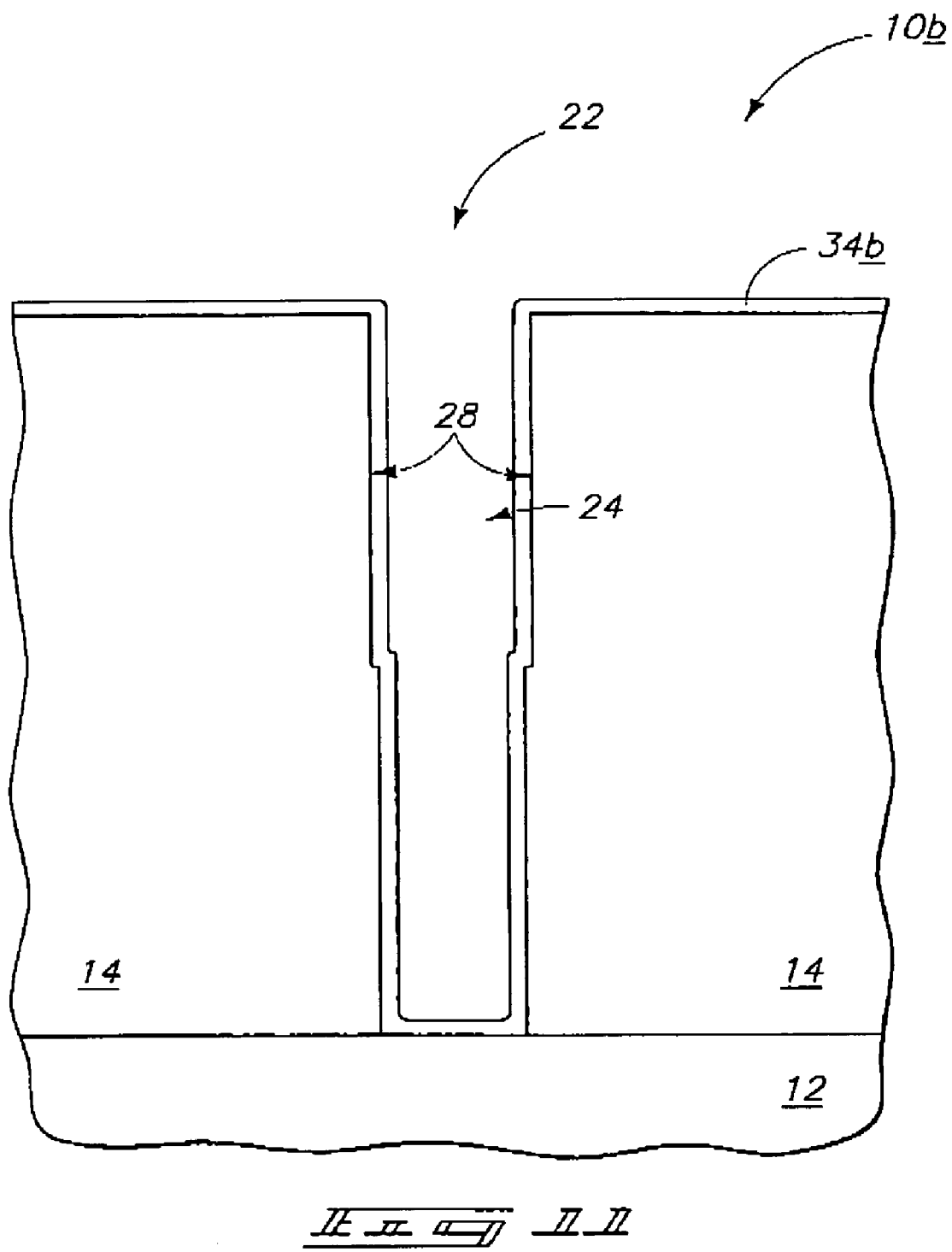
FIG. 11 is a diagrammatic, cross-sectional view of a semiconductor wafer fragment in process in accordance with an aspect of the invention.

Further by way of example only, FIG. 11 illustrates another exemplary alternate embodiment substrate fragment 10*b*. Like numerals from the first-described embodiment have been utilized where appropriate, with differences being indicated with the suffix "b". FIG. 11 is similar to the FIG. 10 construction, however wherein conductive material 30 (not shown) has been removed after the second etching and prior to the deposition of an exemplary material 34*b*.

The above-described, exemplary preferred embodiments depict the plasma etching of FIG. 7 as extending opening 24 completely through dielectric material 14. However, aspects of the invention are not so limited, and it may be desirable to only partially extend the opening deeper within dielectric material 14, for example as a prelude to a subsequent etching step, or in the fabrication of a circuit component within dielectric material 14 without extending completely therethrough.

Figure 12:
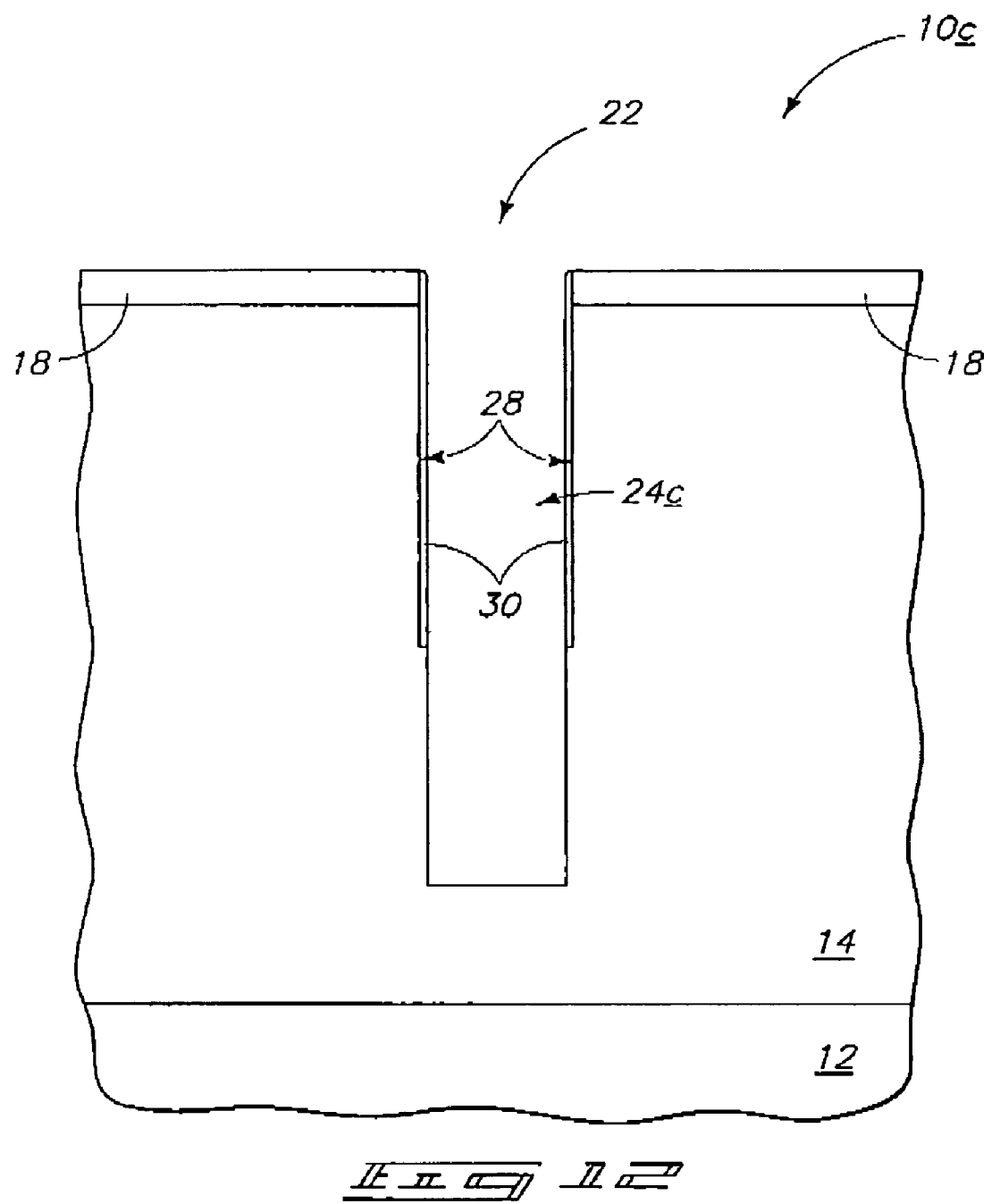
FIG. 12 is a diagrammatic, cross-sectional view of a semiconductor wafer fragment in process in accordance with an aspect of the invention.

For example, FIG. 12 illustrates an alternate exemplary substrate fragment 10*c*. Like numerals from the first-described embodiment have been utilized where appropriate, with differences being indicated with the suffix "c". FIG. 12 differs from that of FIG. 7 in depicting opening 24*c* as not having been etched completely through dielectric material 14. Accordingly, a conductive, semiconductive and/or insulative structure/component might be formed within opening 24c without necessarily making conductive contact with any portion of substrate 12.

Figure 13:
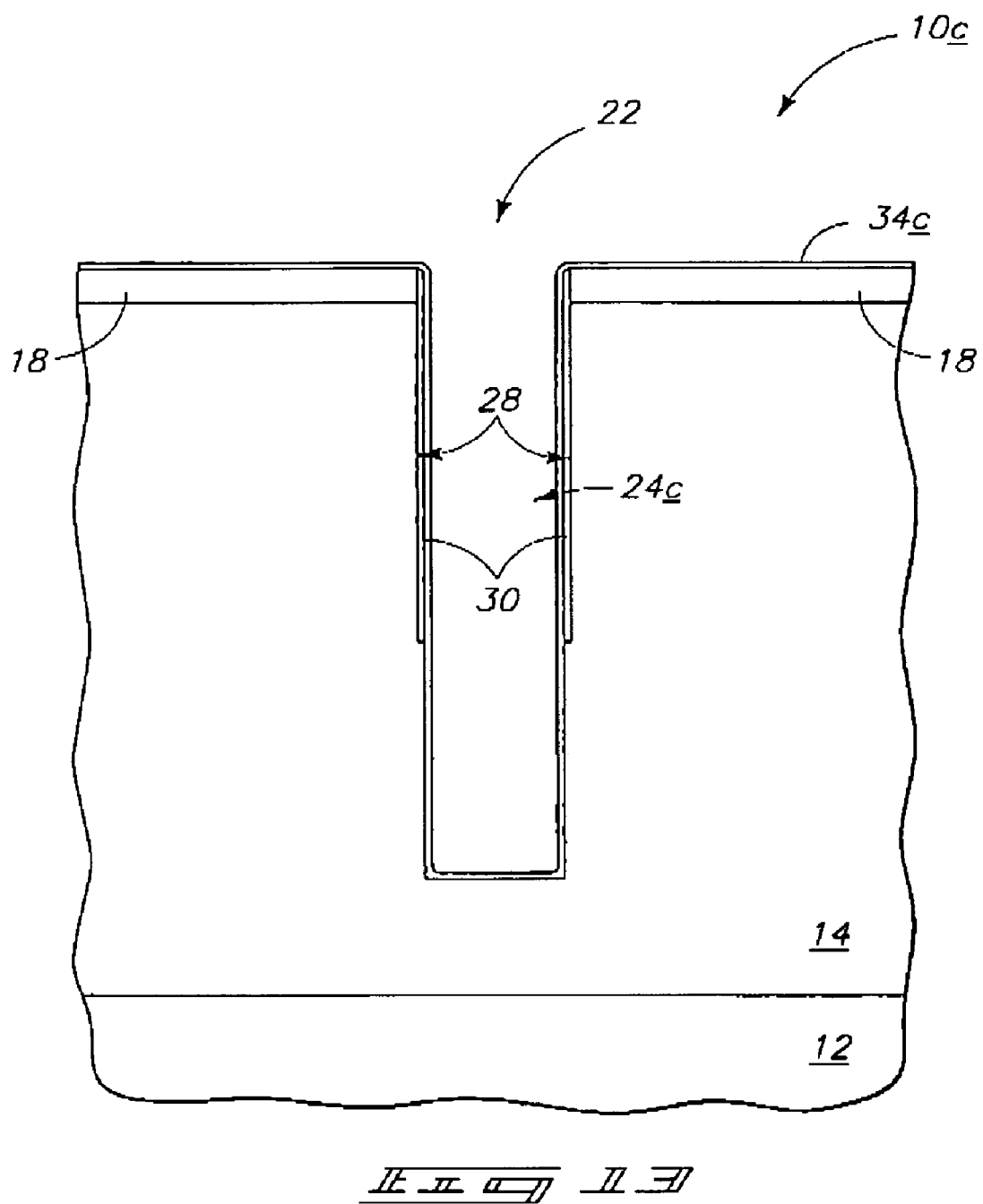
FIG. 13 is a view of the FIG. 12 wafer fragment at a point of processing subsequent to that depicted by FIG. 12.
Figure 14:
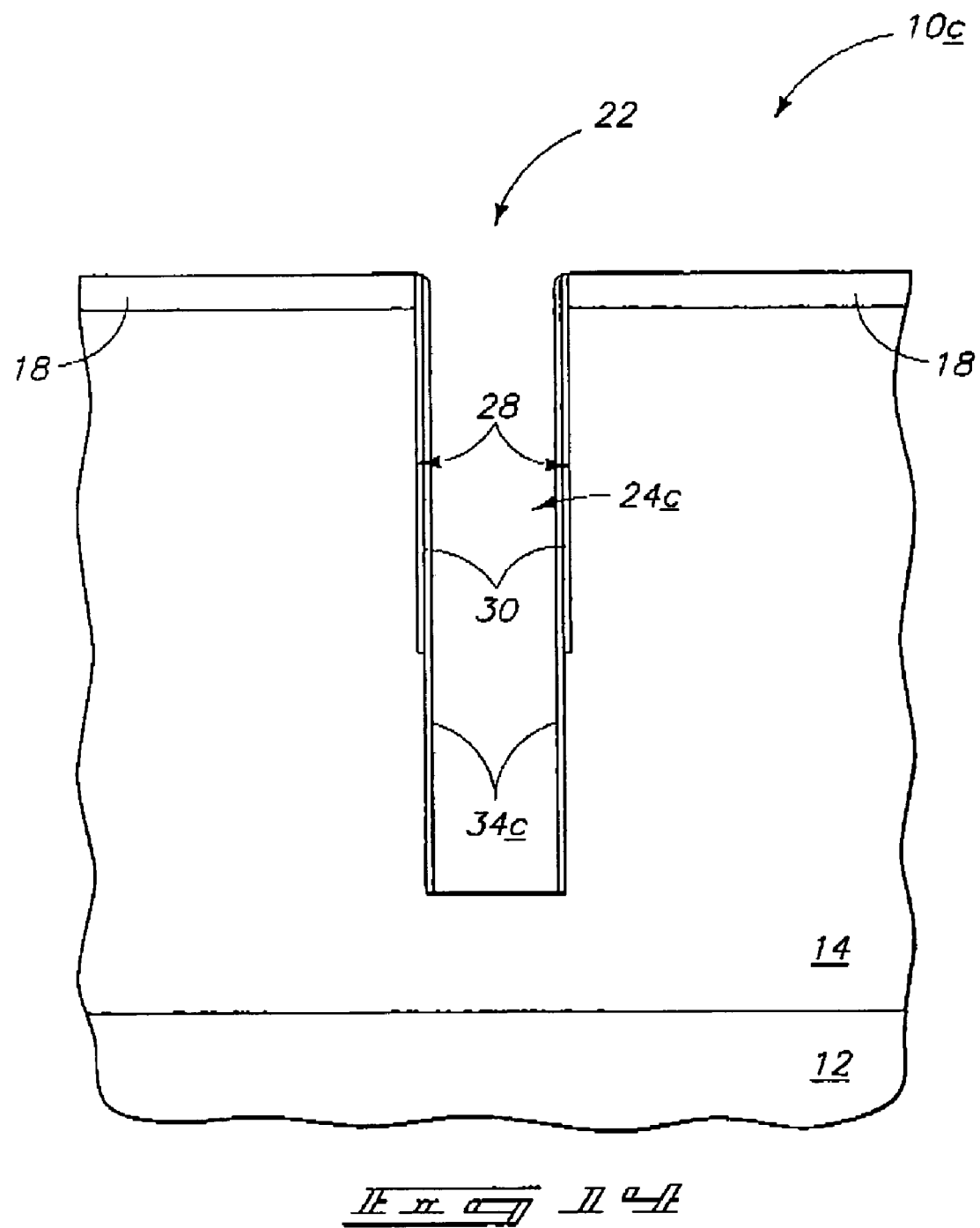
FIG. 14 is a view of the FIG. 13 wafer fragment at a point of processing subsequent to that depicted by FIG. 13.
Figure 15:
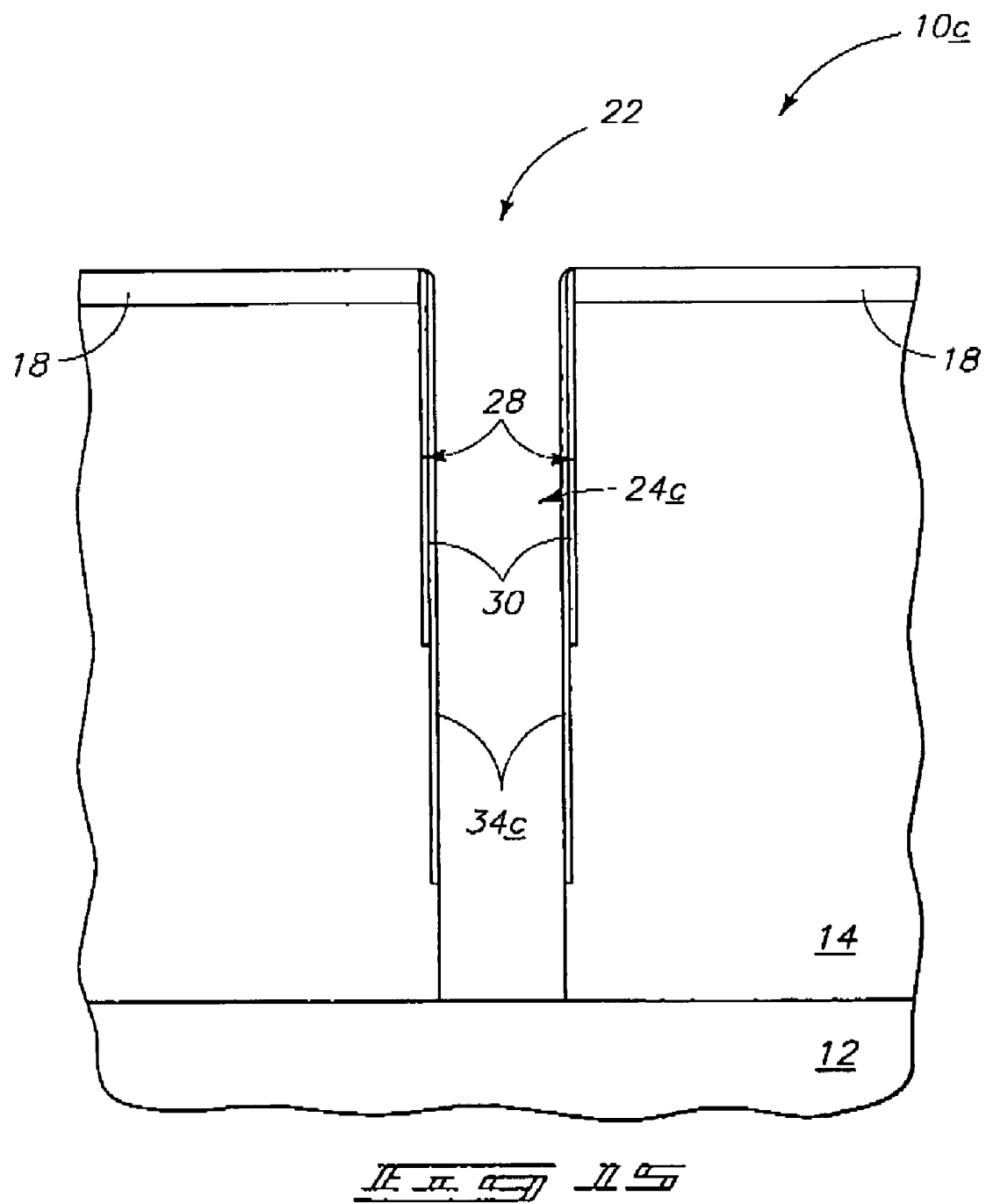
FIG. 15 is a view of the FIG. 14 wafer fragment at a point of processing subsequent to that depicted by FIG. 14.

Further and regardless, the above-described processing might be repeated. For example, FIG. 13 depicts the lining of the lowest portions of the sidewalls of extended opening 24c with electrically conductive material 34c. FIGS. 14 and 15 depict the subsequent plasma etching of dielectric material 14 to further extend opening 24c deeper within dielectric material 14, which again may or may not extend such opening completely through dielectric material 14. Accordingly, the above processing can be repeated in part or in whole, if desired, in etching an opening within the dielectric material in more than two etching steps.

Figure 16:
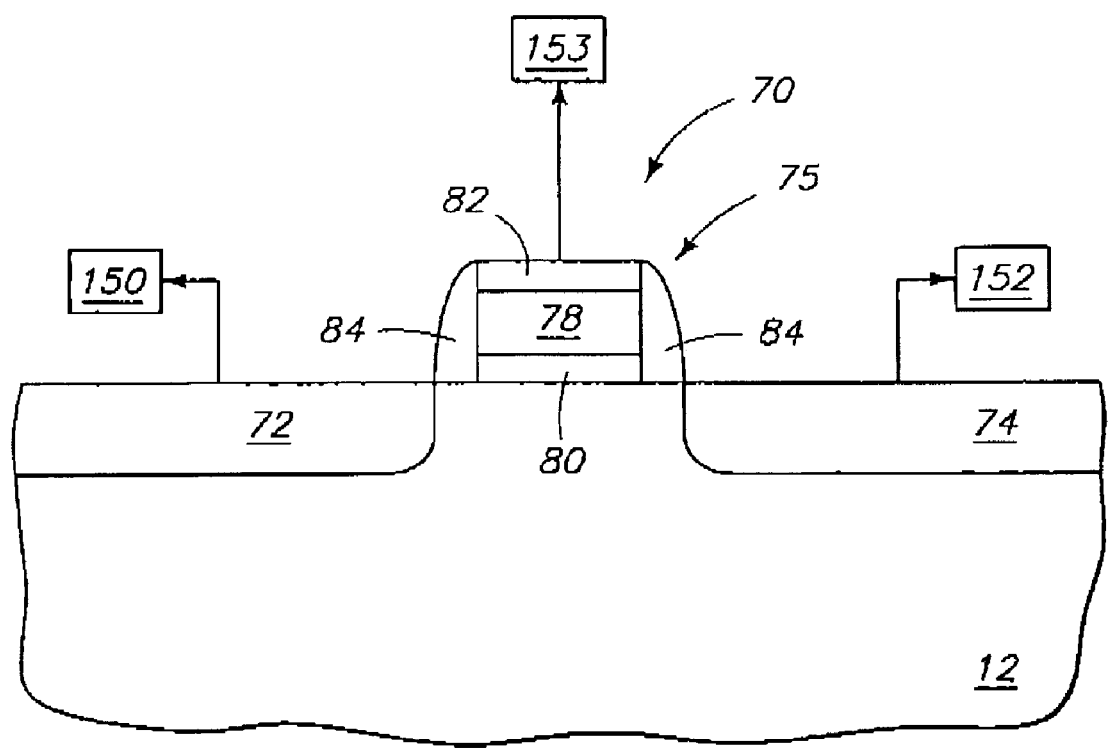
FIG. 16 is a diagrammatic, cross-sectional view of a semiconductor wafer fragment in process in accordance with an aspect of the invention.

Aspects of the invention include fabricating integrated circuitry, as might comprise any circuit, or sub-circuit. Further by way of example only, such might comprise memory circuitry, for example DRAM circuitry. For example, FIG. 16 depicts a field effect transistor 70 incorporated into a DRAM memory cell. Specifically, transistor 70 is depicted as comprising opposing source/drain regions 72 and 74 having a gate construction 75 received operably therebetween. Gate construction 75 is depicted as comprising an electrically conductive portion 78, a gate dielectric 80, an insulative cap 82, and insulative sidewall spacers 84. Field effect transistor construction 70 is of course exemplary only, and any other construction (whether existing or yet-to-be developed) is contemplated, for example vertical and/or recessed constructions. Source/drain region 72 is electrically connected to a storage device 150, and source/drain region 74 is electrically connected to a bitline 152. Electrically conductive portion 78 of gate construction 75 is electrically connected to a gate control contact 153. Storage device 150 can comprise any suitable device, including a capacitor, for example, and also one which could include a container capacitor storage node as described above. Bitline 152 can comprise any suitable construction. The field effect transistor can be considered to be part of an integrated circuit, for example the DRAM integrated circuitry just described.

FIG. 17 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 18. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

FIG. 19 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and 10 devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

FIG. 20 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention.

At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an opening into dielectric material, comprising:

forming patterned masking material over dielectric material of a substrate, the masking material comprising outer and inner layers of different composition materials;

first etching an opening partially into the dielectric material using the patterned masking material as a mask, the opening comprising opposing sidewalls;

after the first etching, removing all of the outer layer while leaving at least some of the inner layer at least proximate the opening;

after the removing, depositing an electrically conductive material over remaining of the inner layer and to within the opening over at least respective portions of the opposing sidewalls and to less than fill the opening; and while said electrically conductive material is over said respective portions of the opposing sidewalls within the opening and is less than filling the opening, second etching the dielectric material to extend the opening deeper within the dielectric material, the second etching comprising plasma etching.

2. The method of claim 1 wherein all of the inner layer is electrically conductive.

3. The method of claim 1 wherein all of the inner layer is electrically insulative.

4. The method of claim 1 wherein at least some of the inner layer remains over the substrate after the second etching; and comprising after the second etching, removing all remaining of the inner layer from the substrate.

5. A method of forming an opening into dielectric material, comprising:

forming patterned masking material over dielectric material of a substrate, the masking material consisting essentially of only two layers of different composition materials;

first etching an opening partially into the dielectric material using the patterned masking material as a mask, the opening comprising a lowest point of dielectric material and opposing sidewalls;

after the first etching, depositing an electrically conductive material over the patterned masking material and to within the opening over at least respective portions of the opposing sidewalls and over the opening lowest point, the electrically conductive material less than filling the opening;

after said depositing, etching the conductive material effective to expose the opening lowest point of dielectric material; and after the etching of said electrically conductive material and while said electrically conductive material is over said respective portions of the opposing sidewalls within the opening and is less than filling the opening, second etching the dielectric material to extend the opening deeper within the dielectric material, the second etching comprising plasma etching.

6. The method of claim 1 wherein said depositing covers all of the opposing sidewalls with the electrically conductive material.

7. The method of claim 1 wherein the opening prior to said depositing has an aspect ratio of at least 10:1.

8. The method of claim 7 wherein the opening prior to said depositing has an aspect ratio of at least 15:1.

9. The method of claim 1 wherein the electrically conductive material has a lateral thickness over the opposing sidewall portions of from 0.1% to 40% of a minimum open dimension of an outermost portion of the opening prior to said depositing.

10. The method of claim 9 wherein the lateral thickness is from 3% to 10% of said minimum open dimension.

11. The method of claim 1 comprising removing the conductive material from the opening after the second etching.

12. The method of claim 1 comprising depositing another material to within the opening over the electrically conductive material lining the respective sidewall portions after the plasma etching, and comprising forming integrated circuitry, said another material and said electrically conductive material lining the respective sidewall portions comprising portions of the integrated circuitry.

13. The method of claim 1 comprising depositing additional electrically conductive material to within the opening over the electrically conductive material received over the respective sidewall portions after the second etching, and comprising forming integrated circuitry, said additional conductive material and said electrically conductive material received over the respective sidewall portions comprising portions of the integrated circuitry.

14. The method of claim 13 wherein the additional electrically conductive material is of the same composition as that of the electrically conductive material received over the respective sidewall portions.

15. The method of claim 13 wherein the additional electrically conductive material is of different composition from that of the electrically conductive material received over the respective sidewall portions.

16. The method of claim 13 comprising forming the additional electrically conductive material and the electrically conductive material lining the respective sidewall portions into a capacitor electrode received at least partially within the extended opening.

17. The method of claim 1 wherein the second etching extends the opening completely through said dielectric material.

18. The method of claim 1 wherein the second etching does not extend the opening completely through said dielectric material.

19. The method of claim 18 comprising after the second etching, lining lowest portions of sidewalls of the extended opening with electrically conductive material, and subsequently plasma etching said dielectric material to further extend the opening deeper within said dielectric material.

20. The method of claim 1 wherein all of the inner layer is semiconductive.

21. The method of claim 5 wherein at least some masking material remains over the substrate after the second etching; and comprising after the second etching, removing all remaining of the masking material from the substrate.

22. The method of claim 5 wherein at least some masking material remains over the substrate after the second etching; and comprising forming integrated circuitry, said at least some of the masking material that remains comprising a portion of the integrated circuitry.

23. The method of claim 5 wherein said depositing covers all of the opposing sidewalls with the electrically conductive material.

24. The method of claim 5 wherein the electrically conductive material has a lateral thickness over the opposing sidewall portions of from 0.1% to 40% of a minimum open dimension of an outermost portion of the opening prior to said depositing.

25. The method of claim 5 comprising removing the conductive material from the opening after the second etching.

26. The method of claim 5 comprising depositing another material to within the opening over the electrically conductive material lining the respective sidewall portions after the plasma etching, and comprising forming integrated circuitry, said another material and said electrically conductive material lining the respective sidewall portions comprising portions of the integrated circuitry.

27. The method of claim 5 comprising depositing additional electrically conductive material to within the opening over the electrically conductive material received over the respective sidewall portions after the second etching, and comprising forming integrated circuitry, said additional conductive material and said electrically conductive material received over the respective sidewall portions comprising portions of the integrated circuitry.

28. A method of forming an opening into dielectric material, comprising:
   forming patterned masking material over dielectric material of a substrate;
   first etching an opening partially into the dielectric material using the patterned masking material as a mask, the opening comprising opposing sidewalls;
   after the first etching, removing only some of the patterned masking material from the substrate at least proximate the opening;
   after the removing, depositing an electrically conductive material over remaining of the patterned masking material and to within the opening over at least respective portions of the opposing sidewalls and to less than fill the opening;
   while said electrically conductive material is over said respective portions of the opposing sidewalls within the opening and is less than filling the opening, second etching the dielectric material to extend the opening deeper within the dielectric material using said remaining of the patterned masking material as a mask, the second etching comprising plasma etching, at least some of said remaining masking material remaining over the substrate after the second etching; and
   after the second etching, removing all of what was left of said remaining masking material from the substrate.

29. A method of forming an opening into dielectric material, comprising:
   forming patterned masking material over dielectric material of a substrate, the masking material comprising outer and inner layers of different composition materials, all of the inner layer being electrically conductive;
   first etching an opening partially into the dielectric material using the patterned masking material as a mask, the opening comprising opposing sidewalls;
   after the first etching, removing only some of the patterned masking material from the substrate at least proximate the opening;
   after the removing, depositing an electrically conductive material over remaining of the patterned masking material and to within the opening over at least respective portions of the opposing sidewalls and to less than fill the opening; and
   while said electrically conductive material is over said respective portions of the opposing sidewalls within the opening and is less than filling the opening, second etching the dielectric material to extend the opening deeper within the dielectric material, the second etching comprising plasma etching.

30. A method of forming an opening into dielectric material, comprising:
   forming patterned masking material over dielectric material of a substrate, the masking material comprising outer and inner layers of different composition materials, all of the inner layer being semiconductive;
   first etching an opening partially into the dielectric material using the patterned masking material as a mask, the opening comprising opposing sidewalls;
   after the first etching, removing only some of the patterned masking material from the substrate at least proximate the opening;
   after the removing, depositing an electrically conductive material over remaining of the patterned masking material and to within the opening over at least respective portions of the opposing sidewalls and to less than fill the opening; and
   while said electrically conductive material is over said respective portions of the opposing sidewalls within the opening and is less than filling the opening, second etching the dielectric material to extend the opening deeper within the dielectric material, the second etching comprising plasma etching.

31. The method of claim 1 wherein the dielectric material over which the masking material is formed comprises at least one of carbon doped silicon dioxide, hafnium oxide, or germanium oxide.

32. The method of claim 31 wherein the dielectric material over which the masking material is formed comprises carbon doped silicon dioxide.

33. The method of claim 31 wherein the dielectric material over which the masking material is formed comprises hafnium oxide.

34. The method of claim 31 wherein the dielectric material over which the masking material is formed comprises germanium oxide.

35. The method of claim 5 wherein the dielectric material over which the masking material is formed comprises at least one of carbon doped silicon dioxide, hafnium oxide, or germanium oxide.

36. The method of claim 5 wherein the dielectric material over which the masking material is formed comprises at least one of carbon doped silicon dioxide, hafnium oxide, or germanium oxide.

37. The method of claim 29 wherein the dielectric material over which the masking material is formed comprises at least one of carbon doped silicon dioxide, hafnium oxide, or germanium oxide.

38. The method of claim 30 wherein the dielectric material over which the masking material is formed comprises at least one of carbon doped silicon dioxide, hafnium oxide, or germanium oxide.

* * * * *

UNITED STATES PATENT AND TRADEMARK OFFICE
CERTIFICATE OF CORRECTION

PATENT NO. : 7,419,913 B2
APPLICATION NO. : 11/217905
DATED : September 2, 2008
INVENTOR(S) : Graettinger et al.

It is certified that error appears in the above-identified patent and that said Letters Patent is hereby corrected as shown below:

In column 11, lines 29-30, in Claim 24, delete "conductivematerial" and insert -- conductive material --, therefor.

In column 13, line 8, in Claim 36, delete "claim 5" and insert -- claim 28 --, therefor.

Signed and Sealed this

Eleventh Day of November, 2008

JON W. DUDAS
*Director of the United States Patent and Trademark Office*